United States Patent
Michalski et al.

(10) Patent No.: US 10,327,363 B2
(45) Date of Patent: Jun. 18, 2019

(54) FIELD DEVICE FOR USE IN PROCESS AUTOMATION

(71) Applicant: Endress + Hauser GmbH + Co. KG, Maulburg (DE)

(72) Inventors: Bernhard Michalski, Maulburg (DE); Udo Grittke, Steinen (DE); Herbert Schroth, Schopfheim (DE); Bernd Strutt, Steinen (DE)

(73) Assignee: ENDRESS+HAUSER SE+CO.KG, Maulburg (DE)

( * ) Notice: Subject to any disclaimer, the term of this patent is extended or adjusted under 35 U.S.C. 154(b) by 0 days.

(21) Appl. No.: 15/568,504

(22) PCT Filed: Apr. 27, 2016

(86) PCT No.: PCT/EP2016/059359
§ 371 (c)(1),
(2) Date: Oct. 23, 2017

(87) PCT Pub. No.: WO2016/180635
PCT Pub. Date: Nov. 17, 2016

(65) Prior Publication Data
US 2018/0160574 A1 Jun. 7, 2018

(30) Foreign Application Priority Data
May 11, 2015 (DE) .................. 10 2015 107 306

(51) Int. Cl.
*H05K 5/02* (2006.01)
*H05K 9/00* (2006.01)
*H05K 7/14* (2006.01)

(52) U.S. Cl.
CPC ......... *H05K 9/0007* (2013.01); *H05K 5/0239* (2013.01); *H05K 5/0247* (2013.01); *H05K 7/1462* (2013.01); *H05K 9/0047* (2013.01)

(58) Field of Classification Search
None
See application file for complete search history.

(56) References Cited

U.S. PATENT DOCUMENTS 2,558,246 A * 6/1951 Gray ................. H01M 2/06
285/200
4,202,081 A * 5/1980 Johnston ............. G01L 9/0086
29/25.41

(Continued)

FOREIGN PATENT DOCUMENTS

CN 101292387 A 10/2008
DE 10 2007 037 364 A1 2/2009

(Continued)

OTHER PUBLICATIONS

German Search Report, German PTO, Munich, dated Dec. 19, 2015.

(Continued)

*Primary Examiner* — Xanthia C Cunningham
(74) *Attorney, Agent, or Firm* — Bacon & Thomas, PLLC

(57) ABSTRACT

A field device has a housing providing EMC-protection. The housing includes a conductive housing core, which is surrounded on all sides by a non-conductive housing jacket secured thereon by force-interlocking, e.g. frictional interlocking, or by material bonding. At least one electrically conductive barrier is placed on and connected with an electrically conducting region of the housing core and divides the interior of the housing into at least two chambers with different degrees of EMC-protection. The barrier contains a passageway, with which at least a first electronic circuit and a second electronic circuit, which are located in different chambers, are contacted with one another. The circuits are contacted by spring contacts against regions of the housing core, which are led through the housing jacket into the interior, wherein transitions to a sensor—or lid in the housing by means of screw thread—and/or wiping contacts (Continued)

are so arranged that these kinds of components are electrically connected with the housing core and wherein seals of the transitions protect against environmental influences.

17 Claims, 1 Drawing Sheet

(56) References Cited

U.S. PATENT DOCUMENTS

| | | | | |
|---|---|---|---|---|
| 4,590,466 | A * | 5/1986 | Wiklund | C21B 7/24 340/870.11 |
| 4,663,974 | A * | 5/1987 | Scherer | G01L 9/007 73/708 |
| 4,843,886 | A * | 7/1989 | Koppers | G01L 9/0029 73/728 |
| 5,637,802 | A * | 6/1997 | Frick | G01L 9/0075 361/283.4 |
| 6,484,585 | B1 * | 11/2002 | Sittler | G01L 9/0075 73/718 |
| 6,586,949 | B1 * | 7/2003 | Sargent | G01N 27/221 324/664 |
| 6,615,665 | B1 * | 9/2003 | Flogel | G01L 9/0073 361/283.1 |
| 7,036,983 | B2 * | 5/2006 | Green | G01K 1/10 136/232 |
| 9,130,421 | B2 * | 9/2015 | Chamberlin | H02K 5/20 |
| 9,237,684 | B2 * | 1/2016 | Ruf | G01F 23/00 |
| 9,674,976 | B2 * | 6/2017 | Strei | H05K 7/1462 |
| 2002/0011115 | A1 * | 1/2002 | Frick | G01D 11/245 73/718 |
| 2002/0180108 | A1 | 12/2002 | Koshiba | |
| 2003/0075547 | A1 * | 4/2003 | Stocchi | B23Q 1/015 220/592.01 |
| 2005/0223781 | A1 * | 10/2005 | Renk | G01L 19/0084 73/46 |
| 2006/0055006 | A1 | 3/2006 | Orth et al. | |
| 2007/0095146 | A1 * | 5/2007 | Brosh | G01L 9/0085 73/722 |
| 2007/0152516 | A1 * | 7/2007 | Lee | H02K 33/16 310/15 |
| 2009/0091340 | A1 * | 4/2009 | Kim | G01R 27/2623 324/722 |
| 2009/0130530 | A1 | 5/2009 | Tanaka | |
| 2009/0314093 | A1 * | 12/2009 | Hausler | H05K 7/1462 73/717 |
| 2010/0206708 | A1 * | 8/2010 | Priest | G01M 3/3272 200/81 R |
| 2011/0127776 | A1 * | 6/2011 | Schulte | H02N 11/008 290/1 A |
| 2012/0099264 | A1 * | 4/2012 | Degner | G06F 1/1616 361/679.09 |
| 2013/0234570 | A1 * | 9/2013 | Hsu | G06F 1/187 312/223.1 |
| 2013/0306345 | A1 * | 11/2013 | Wentzel | H01R 4/646 174/93 |
| 2014/0024250 | A1 * | 1/2014 | Spencer | H01R 13/523 439/521 |
| 2014/0083872 | A1 * | 3/2014 | Fuerst | A61B 5/14532 205/792 |
| 2014/0190841 | A1 | 7/2014 | Nash | |
| 2015/0016075 | A1 * | 1/2015 | Ruf | G01F 23/00 361/752 |
| 2015/0174817 | A1 * | 6/2015 | Roach | B64B 1/58 156/64 |
| 2015/0207265 | A1 * | 7/2015 | Plant | H01R 13/523 439/271 |
| 2015/0230357 | A1 * | 8/2015 | Fink | H05K 7/1462 361/809 |
| 2015/0351259 | A1 * | 12/2015 | Ding | H01R 13/6581 312/223.1 |
| 2017/0252018 | A1 * | 9/2017 | Wrigglesworth | A61B 5/6861 |
| 2017/0284884 | A1 * | 10/2017 | Kim | F01N 13/08 |

FOREIGN PATENT DOCUMENTS

| | | |
|---|---|---|
| DE | 10 2009 022 762 A1 | 10/2010 |
| DE | 10 2011 088 302 A1 | 6/2013 |
| DE | 10 2015 107 306 A1 | 11/2016 |
| EP | 0 048 488 A1 | 3/1982 |
| EP | 2 239 546 A1 | 10/2010 |
| WO | 2014/013480 A2 | 1/2014 |
| WO | 2016/180635 A1 | 11/2016 |

OTHER PUBLICATIONS

International Search Report, EPO, The Netherlands, dated Jul. 11, 2016.

Chinese Office Action in corresponding Chinese Application No. 201680027552.9, dated Dec. 25, 2018.

* cited by examiner

FIELD DEVICE FOR USE IN PROCESS AUTOMATION

TECHNICAL FIELD

The invention relates to a field device for use in process automation, comprising a housing for EMC-shielding, which surrounds an interior, which is composed of at least a first chamber and a second chamber, at least one sensor, which is arranged in the first chamber and serves for measurement transducing from a physical variable into a first electrical measured variable, at least a first electronic circuit, which is arranged in the first chamber and serves for operating the sensor and processing the first measured variable into an intermediate signal, at least a second electronic circuit, which is accommodated in the second chamber and serves for supplying power to the first electronic circuit and for changing the intermediate signal into an output signal, which can be output via a connection line, and at least one electrically conductive barrier, which isolates the two chambers spatially from one another, so that they represent different EMC-regions.

BACKGROUND DISCUSSION

Known from the state of the art are field devices, which are used in industrial plants. Field devices are often applied in process automation technology as well as in manufacturing automation technology. Referred to as field devices are, in principle, all devices, which are applied near to the process and which deliver, or process, process relevant information. Thus, field devices are used for registering and/or influencing process variables. Serving for registering process variables are measuring devices, i.e. sensors. These are used, for example, for pressure- and temperature measurement, measuring conductivity, flow measurement, etc. and register the corresponding process variables, pressure, temperature, conductivity, pH-value, fill level, flow, etc. Used for influencing process variables are actuators. These are, for example, pumps or valves, which can influence the flow of a liquid in a pipe or the fill level in a container. Besides the above mentioned measuring devices and actuators, the terminology, field devices, also includes remote I/Os, radio adapters, and, generally, devices, which are arranged at the field level.

A large number of such field devices are produced and sold by the Endress+Hauser group of companies.

Many field devices for process automation are exposed to various environmental influences, dependent on their location of use. In different branches of industry, thus, different influences reign, which require different protective measures.

A common solution is to use housings of metal. These are manufactured, for example, of VA steel, aluminum, and the like. For purposes of corrosion prevention, these metal housings are provided with various coatings. This is, however, in given cases, a more expensive method step.

Likewise housings of plastic are offered. These have from the corrosion point of view considerable advantages compared with metal housings. They have, however, the disadvantage that they are inferior compared with the mechanical robustness of metal housings. For manufacturers of field devices, the result is that devices must be offered both with metal housings as well as also with plastic housings.

For the electronic circuits accommodated in the housings, however, there result therefrom, as regards EMC-protection, considerable differences, which come down to differently required protective measures for metal and plastic material and result in considerable extra developmental effort. In the state of the art, plastic housings are provided with a thin metal layer on the housing interior, applied by means of various methods, such as, for example, vapor deposition, lacquering, sputtering, galvanizing, etc., in order to form a Faraday cage. These layers are, however, very thin and do not provide any additional mechanical stability for the housing. Moreover, these manufacturing processes can be costly.

SUMMARY OF THE INVENTION

An object of the present invention is to provide a process automation field device, whose housing can be manufactured cost effectively.

The object is achieved by a housing, which is composed of a housing core of conductive material and a housing jacket of a non-conductive material surrounding the housing core on all sides.

In a preferred embodiment, the housing core is composed of metal, while the housing jacket is manufactured of plastic.

An advantage in the choice of these materials is that the housing can be manufactured with cost-savings, since complex coatings of the metal housing and the applying of thin metal layers on the plastic are not required.

The field device of the invention offers, moreover, the advantage that it is applicable universally in the most varied of branches of industry independently of environmental influences. The housing core offers the required robustness against mechanical influences. The housing jacket provides the best corrosion protection. The conductive housing core assures, moreover, a shielding from electromagnetic disturbances.

In an embodiment, the housing core is composed of at least one, preferably two or more individual components.

In an embodiment, the housing jacket is applied on the housing core by force interlocking, e.g. frictional interlocking, or by material bonding, in order to provide additional mechanical stability.

In a preferred embodiment, the housing jacket is applied on the housing core by an injection molding method. By manufacturing by means of an injection molding method, a large number of units can be produced at small manufacturing prices. The manufacturing process is accelerated compared with previous manufacturing processes of housings for field devices, since special surface treatments of the utilized components can be avoided.

In a preferred variant, the housing jacket is applied on the housing core by a shrink connection.

This variant is described in DE102014105569A1 for the half shells of the housing of a magneto inductive measuring device and offers the advantage of very fast manufacture at low manufacturing costs.

In an advantageous embodiment, the housing jacket is applied on the housing core by a snap connection.

In a preferred embodiment, the housing jacket is applied on the housing core by a screwed connection.

In an advantageous variant, the housing jacket is applied on the housing core by a rivet connection.

In a preferred embodiment, the housing jacket is applied on the housing core by an adhesive connection.

In a further development, used as the at least one electrically conductive barrier is a conductive plate with a passageway for connecting the first and second electronic circuits, wherein the conductive plate is placed on and connected with an electrically conducting region of the housing core, whereby different chambers with different degrees of EMC-protection can be created in the interior of the housing.

The sensor electronics of the first electronic circuit can thereby, moreover, be isolated from the electronics of a second, signal processing circuit, in order to lessen disturbing influences. The passageway permits the electrical connecting of the first and second electronic circuits with one another.

In an advantageous embodiment, electrical grounding contacts, which are in electrical connection with the housing core, are led through the housing jacket and provided with a corrosion resistant contact, whereby an external grounding can be established.

In an advantageous embodiment, in the interior at least one grounding terminal is so mounted and arranged that it is electrically contacted to the housing core. In this way, a grounding brought with an external communication signal can be connected with the device core.

In an advantageous variant, regions of the housing core are led through the jacket into the interior, whereby grounding connections of the first electronic circuit are electrically contacted by means of spring contacts.

In an embodiment, transitions between the housing and, for example, a sensor unit are so placed and arranged that these are connected by screw thread and/or sliding contacts electrically with the housing core, in order to enable simple replacement of such units, without the replacement requiring replacement of the entire housing.

In an embodiment, the transitions are provided with seals, for example, silicone seals and the like, which protect the transitions against environmental influences. In this way, the field device can be used in process environments with difficult environmental conditions.

In an advantageous embodiment, a housing lid is so mounted and arranged that it is connected electrically with the housing core.

The possibility of contacting the electrically conductive housing core by means of spring contacts using regions led into the interior, for example, for grounding connections of the contained electronics, and the option of connecting sensors, lid or other components by means of threads and/or wiping contacts electrically with the housing core, offers the opportunity of universal applicability for the most varied of forms of embodiment of the field device.

A further advantage results from the fact that it is possible, because of the electrical insulation provided by the non-conductive housing jacket on the inner side of the housing, to arrange circuit conductors closely to the inner side of the housing, without experiencing short-circuiting due to a contacting of these conductors with the housing ground.

BRIEF DESCRIPTION OF THE DRAWINGS

The invention will now be explained in greater detail based on the appended drawing, the sole FIGURE of which shows as follows.

DETAILED DISCUSSION IN CONJUNCTION WITH THE DRAWINGS

Figure 1:
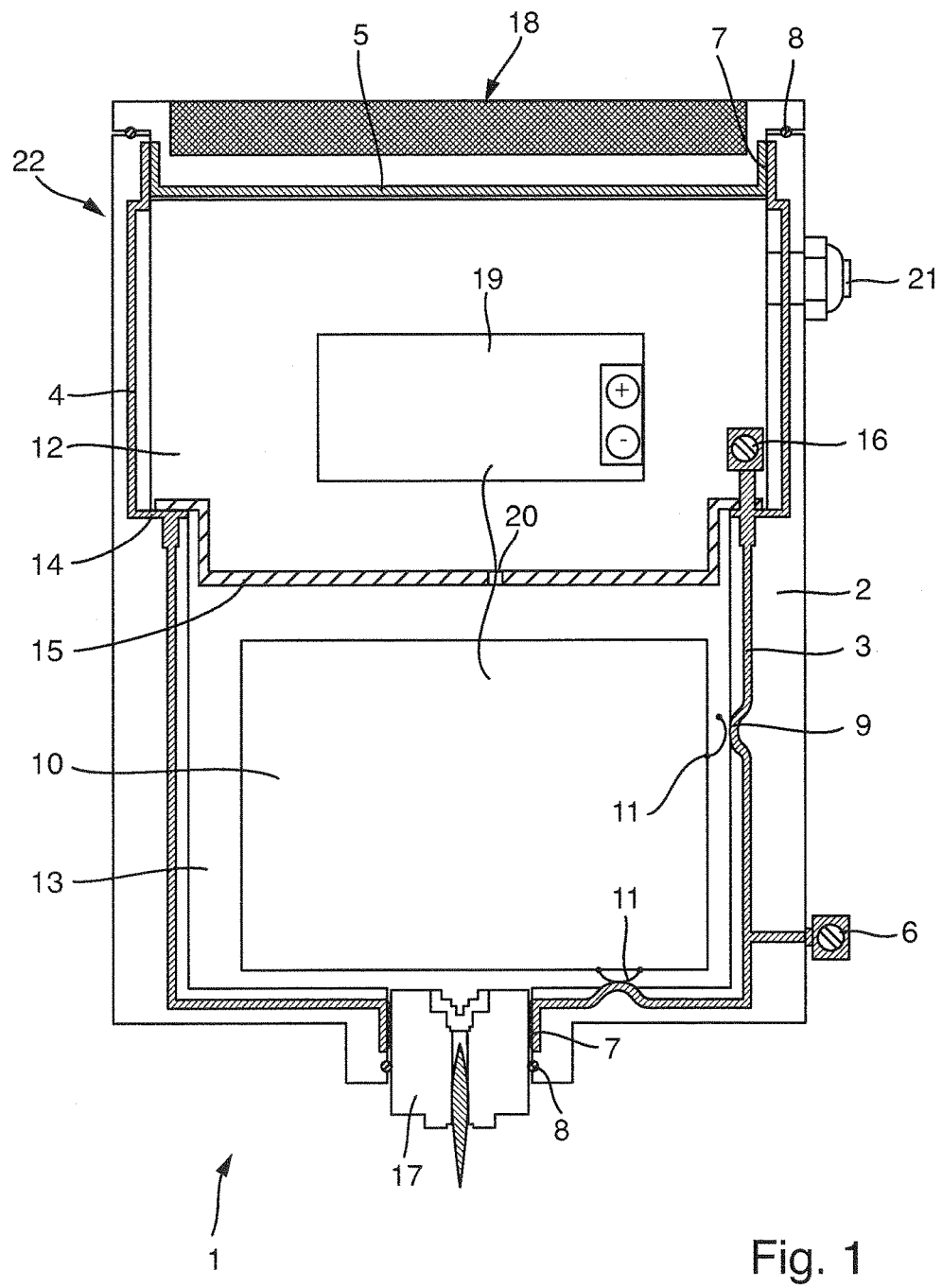
FIG. 1 is a cross section of a field device 1 of the invention.

FIG. 1 shows a cross section of a field device 1 of the invention based on the example of a measuring device. The electrically conductive housing core 3 forms the foundation of the housing 22. The housing core 3 assures mechanical stability of the housing 22. The housing core 3 can be formed as a thin, deep drawn piece of sheet metal, for example, of copper, VA steel, iron, etc., or by a suitable casting method, such as, for example, aluminum die casting, and surrounds an interior. The housing core 3 can, in such case, be composed of one or more parts. Thus, for example, a lid 18, composed of the same material combination as the housing 22, can be provided.

The housing core 3 is surrounded on all sides by a non-conductive housing jacket 2. This is composed of a plastic, for example, polyamide (PA), polyetheretherketone (PEEK), etc. and can be formed by means of various methods, such as injection molding, and is connected with the housing core 3 by force interlocking or by material bonding, thus, for example, by a snap connection, a shrink connection, a screwed connection, a rivet connection or an adhesive connection.

At least one conductive plate 15 is placed as an electrically conductive barrier on and electrically connected to an electrically conducting, exposed region 14 of the housing core 3. In this way, the interior of the housing is divided into at least two regions, which, in each case, is surrounded by a Faraday cage, which housing core 3 and conductive plate 15 form. In this way, at least two chambers 12, 13 are formed, which can have different degrees of EMC-protection. The first electronic circuit 10 and the second electronic circuit 19 are arranged spaced from one another in their respective chambers 12, 13. Since the primary sensor signal is very disturbance-susceptible, the degree of EMC-protection in the first chamber 13 must be high, because of which information is exchanged with the environment by means of a connection line 21 into the second chamber 12. The connection of the two circuits 10, 19 is enabled by means of a passageway 20 in the conductive plate 15.

For shielding from electromagnetic disturbance signals, the Faraday cage, which is formed by the housing core 3 and the conductive plate 15 connected therewith, and the electrical circuits 10, 19 must be placed at the same ground potential. Grounding contacts 6 on the outside of the housing jacket 2 and led through the housing jacket 2 offer the opportunity for attaching an external ground. If the external communication signal brought via the device connection, for example, via a plug-in socket, has its own ground, then the housing core 3 can be placed at such ground potential via an internal grounding terminal 16. Electronic elements of the electronic circuits 10, 19 can access, for example, by means of spring contacts 11, the ground potential of the housing core 3 via regions 9 of the housing core 3 led through the housing jacket 2.

If in the housing 22 transitions 7 are present, for example, between an installed sensor unit 17 and the housing 22, or a lid 18 and the housing 22, then an electrical connection can be established by means of screw threads and/or wiping contacts. In order that these transitions 7 are protected against environmental influences, they are provided with seals 8. The seals 8 can be, for example, molded seals of a thermoplastic elastomer.

The invention claimed is:
1. A field device for use in process automation, comprising:
   a housing for EMC-shielding with an inside and an outside, which inside of the housing surrounds an interior, which is composed of at least a first chamber and a second chamber;
   at least one sensor, which is arranged in said first chamber and serves for measurement transducing from a physical variable into a first electrical measured variable;

at least a first electronic circuit, which is arranged in said first chamber and serves for operating said at least one sensor and processing the first electrical measured variable into an intermediate signal;

at least a second electronic circuit, which is accommodated in said second chamber and serves for supplying power to said first electronic circuit and for changing the intermediate signal into an output signal, which can be output via a connection line; and at least one electrically conductive barrier, which isolates said two chambers spatially from one another, so that they represent different EMC-regions, wherein:

said housing is composed of a housing core of conductive material and a housing jacket of a non-conductive material, said housing jacket is applied on the outside and on the inside of said housing core, and in the interior at least one grounding terminal is so mounted and arranged that it is electrically contacted to said electrically conductive barrier and to said housing core.

2. The field device as claimed in claim 1, wherein:
said housing core is composed of metal.

3. The field device as claimed in claim 1, wherein:
said housing jacket is composed of plastic.

4. The field device as claimed in claim 1, wherein:
said housing core is composed of at least one, preferably two or more individual components.

5. The field device as claimed in claim 1, wherein:
said housing jacket is applied on said housing core by force interlocking, e.g. frictional interlocking, or by material bonding.

6. The field device as claimed in claim 1, wherein:
said housing jacket is applied on said housing core by an injection molding method.

7. The field device as claimed in claim 1, wherein:
said housing jacket is applied on said housing core by a shrink connection.

8. The field device as claimed in claim 1, wherein:
said housing jacket is applied on said housing core by a snap connection.

9. The field device as claimed in claim 1, wherein:
said housing jacket is applied on said housing core by a screwed connection.

10. The field device as claimed in claim 1, wherein:
said housing jacket is applied on said housing core by a rivet connection.

11. The field device as claimed in claim 1, wherein:
said housing jacket is applied on said housing core by an adhesive connection.

12. The field device as claimed in claim 1, wherein:
said at least one electrically conductive barrier is a conductive plate with a passageway for connecting said first and said second electronic circuits, said conductive plate is placed on and connected with an electrically conducting region of said housing core.

13. The field device as claimed in claim 1, wherein:
electrical grounding contacts, which are in electrical connection with said housing core, are led through said housing jacket and provided with a corrosion resistant contact.

14. The field device as claimed in claim 1, wherein:
regions of said housing core reach through said jacket into the interior, wherein grounding connections of said first electronic circuit are electrically contactable by means of spring contacts, wherein the spring contacts are connected to said regions.

15. The field device as claimed in claim 1, wherein:
electrical connections of the sensor are connectable by screw thread and/or sliding contacts electrically with said housing core.

16. The field device as claimed in claim 15, wherein:
said electrical connections are provided with seals, which protect against environmental influences.

17. The field device as claimed in claim 1, further comprising:
a housing lid so mounted and arranged that it is connected electrically with said housing core.

* * * * *